(12) United States Patent
Uchida et al.

(10) Patent No.: US 10,696,840 B2
(45) Date of Patent: Jun. 30, 2020

(54) RESIN COMPOSITION FOR SEMICONDUCTOR ENCAPSULATION AND SEMICONDUCTOR DEVICE

(71) Applicant: KYOCERA Corporation, Kyoto-shi, Kyoto (JP)

(72) Inventors: Ken Uchida, Tokyo (JP); Shinichi Kazama, Tokyo (JP); Yoshitake Terashi, Aira (JP)

(73) Assignee: KYOCERA CORPORATION, Kyoto (JP)

( * ) Notice: Subject to any disclaimer, the term of this patent is extended or adjusted under 35 U.S.C. 154(b) by 149 days.

(21) Appl. No.: 15/528,960

(22) PCT Filed: Nov. 5, 2015

(86) PCT No.: PCT/JP2015/081228
§ 371 (c)(1),
(2) Date: May 23, 2017

(87) PCT Pub. No.: WO2016/084578
PCT Pub. Date: Jun. 2, 2016

(65) Prior Publication Data
US 2017/0267859 A1      Sep. 21, 2017

(30) Foreign Application Priority Data

Nov. 26, 2014   (JP) ................. 2014-238769

(51) Int. Cl.
*C08L 63/04*       (2006.01)
*H01L 23/00*     (2006.01)
(Continued)

(52) U.S. Cl.
CPC ............... *C08L 63/04* (2013.01); *C08L 61/06* (2013.01); *C08L 63/00* (2013.01); *C08L 91/06* (2013.01);
(Continued)

(58) Field of Classification Search
CPC ............................. C08L 63/04; H01L 23/295
See application file for complete search history.

(56) References Cited

U.S. PATENT DOCUMENTS

2009/0098447 A1*   4/2009  Murakami .......... H01M 8/0221
                                                                429/129
2009/0099447 A1*   4/2009  De Korte ........... A61B 5/02007
                                                                600/438
(Continued)

FOREIGN PATENT DOCUMENTS

JP     10-158479 A    6/1998
JP   2001-123047 A    5/2001
(Continued)

OTHER PUBLICATIONS

J. Robertson et al; Materials Science and Engineering R; 37; (2002); p. 129-281.*
(Continued)

*Primary Examiner* — Samuel A Gebremariam
*Assistant Examiner* — Jonas T Beardsley
(74) *Attorney, Agent, or Firm* — Volpe and Koenig, P.C.

(57) ABSTRACT

A resin composition for semiconductor encapsulation, containing (A) an epoxy resin, (B) a phenolic resin-based curing agent, (C) an inorganic filler, and (D) amorphous carbon, wherein the amorphous carbon of the component (D) contains 30 atomic % or more of an $SP^3$ structure and 55 atomic % or less of an $SP^2$ structure.

6 Claims, 1 Drawing Sheet

(51) Int. Cl.
*H01L 23/31* (2006.01)
*C08L 63/00* (2006.01)
*H01L 23/29* (2006.01)
*C08L 91/06* (2006.01)
*C08L 61/06* (2006.01)
*H01L 21/56* (2006.01)

(52) U.S. Cl.
CPC .............. *H01L 21/56* (2013.01); *H01L 23/00* (2013.01); *H01L 23/29* (2013.01); *H01L 23/293* (2013.01); *H01L 23/31* (2013.01); *C08L 2203/206* (2013.01); *H01L 2924/0002* (2013.01); *H01L 2924/186* (2013.01)

(56) References Cited

U.S. PATENT DOCUMENTS

| | | | |
|---|---|---|---|
| 2010/0272933 A1 | 10/2010 | McCormick et al. | |
| 2012/0100473 A1* | 4/2012 | Iwamoto | G03G 5/14704 430/56 |
| 2015/0105497 A1* | 4/2015 | Fung | C08K 9/02 523/458 |
| 2016/0122521 A1* | 5/2016 | Wang | C08J 5/18 524/151 |
| 2016/0122604 A1* | 5/2016 | Yoshimoto | C08G 59/32 252/74 |
| 2016/0157334 A1* | 6/2016 | Koukami | H01L 23/3737 361/705 |

FOREIGN PATENT DOCUMENTS

| | | |
|---|---|---|
| JP | 2005-074485 A | 3/2005 |
| JP | 2005-089645 A | 4/2005 |
| JP | 2005-206768 A | 8/2005 |
| JP | 2006-305982 A | 11/2006 |
| JP | 2011-508062 A | 3/2011 |
| JP | 2013-023581 A | 2/2013 |
| WO | 2014/122982 A1 | 8/2014 |

OTHER PUBLICATIONS

J. Robertson; Materials Science and Engineering; R 37 (2002); 129-281 (Year: 2002).*

International Search Report, PCT/JP2015/081228, dated Jan. 12, 2016, 2 pgs.

Korean Office Action, Korean Application No. 10-2017-7011995, dated Feb. 8, 2018, 5pgs.

* cited by examiner

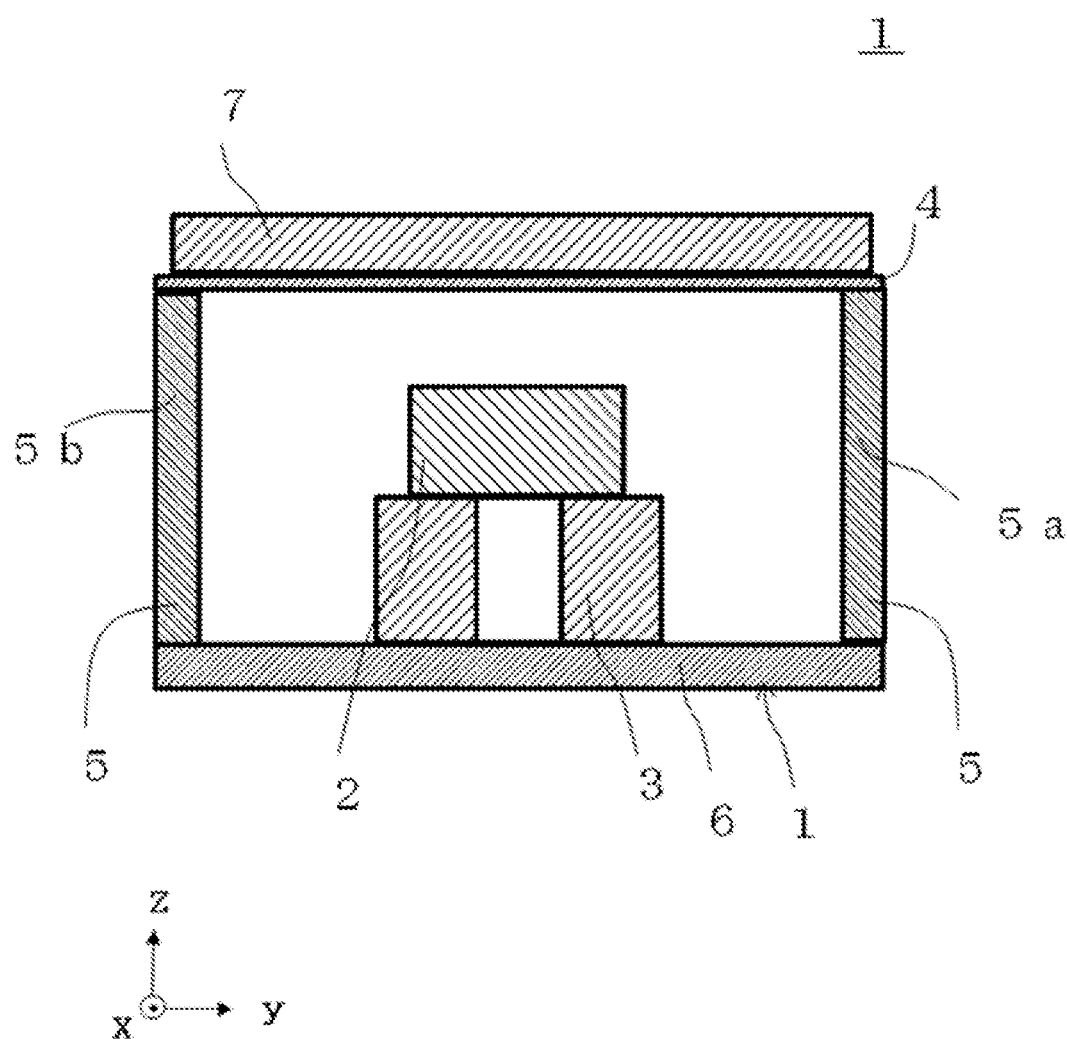

RESIN COMPOSITION FOR SEMICONDUCTOR ENCAPSULATION AND SEMICONDUCTOR DEVICE

TECHNICAL FIELD

The present invention relates to a resin composition for semiconductor encapsulation and to a semiconductor device using the composition.

BACKGROUND ART

Heretofore, with respect to a resin-encapsulated semiconductor device, marking is made using a thermocurable or UV-curable special ink. However, in such a method, much time is taken for marking and curing and, in addition, the ink is not easy to handle.

Consequently, at present, marking with a YAG laser or a carbon dioxide laser is a mainstream. As compared with marking with ink, marking with a YAG laser or a carbon dioxide laser has various advantages in that it is excellent in operability and the working time can be significantly shortened.

However, in marking with a YAG laser or a carbon dioxide laser, the contrast between the marked part and the non-marked part is not sufficient and therefore the marking is not vivid. In addition, reading may often be difficult owing to yellowing to be caused by oxidation of the phenolic resin curing agent in the encapsulating resin.

Accordingly, various studies are being made for improving the laser marking performance of such an encapsulating resin composition for use for encapsulation of semiconductor devices, and for example, some techniques of using carbon black as a black pigment and specifically defining the range of the mean particle size thereof as well as the amount thereof to be added have been proposed (for example, see PTLs 1 to 3).

However, carbon black is electroconductive, and therefore, in the case where carbon black is applied to encapsulation of high-precision wiring in high-integration semiconductor devices in recent years, a risk of leakage (short circuit) may occur. For solving the problem, use of fullerenes almost free from a risk of leakage (short circuit) in place of carbon black has been proposed (for example, see PTL 4).

CITATION LIST

Patent Literature

PTL 1: JP-A 10-158479
PTL 2: JP-A 2001-123047
PTL 3: JP-A 2005-89645
PTL 4: JP-A 2005-206768

SUMMARY OF INVENTION

Technical Problem

However, the encapsulating resin composition using a fullerene, as described in PTL 4, could not realize sufficient characteristics including laser marking performance.

The present invention has been made in consideration of such situations, and its object is to provide a resin composition for semiconductor encapsulation that can be a forming material for a cured product capable of realizing a sufficient contrast in laser marking, capable of providing vivid marking and free from a risk of leakage even when applied to high-precision wiring, and to provide a semiconductor device using the resin composition.

Solution to Problem

The present inventors have assiduously studied for solving the above-mentioned problems and, as a result, have found that, by using amorphous carbon that contains an $SP^3$ structure and an $SP^2$ structure each in a specific proportion, a cured product of a resin composition for semiconductor encapsulation that contains the amorphous carbon exhibits good coloring performance and insulation performance and, accordingly, the cured product realizes a sufficient contrast in laser marking and enables vivid marking, and in addition, even when applied to high-precision wiring, the composition is free from a risk of leakage.

The present invention has been completed on the basis of these findings.

Specifically, the present invention provides the following [1] to [6].

[1] A resin composition for semiconductor encapsulation, containing (A) an epoxy resin, (B) a phenolic resin-based curing agent, (C) an inorganic filler, and (D) amorphous carbon, wherein the amorphous carbon of the component (D) contains 30 atomic % or more of an $SP^3$ structure and 55 atomic % or less of an $SP^2$ structure.
[2] The resin composition for semiconductor encapsulation according to the above [1], wherein the amorphous carbon of the component (D) has a weight average particle size of 0.01 to 50 μm.
[3] The resin composition for semiconductor encapsulation according to the above [1] or [2], wherein the content of the component (C) is from 60 to 95% by mass, and the content of the component (D) is from 0.01 to 5.0% by mass relative to the total amount of the resin composition for semiconductor encapsulation.
[4] The resin composition for semiconductor encapsulation according to any one of the above [1] to [3], wherein the inorganic filler of the component (C) has a mean particle size of 1 to 60 μm and a maximum particle size of 200 μm or less.
[5] The resin composition for semiconductor encapsulation according to any one of the above [1] to [4], wherein the inorganic filler of the component (C) is a silica powder.
[6] A semiconductor device including a semiconductor element encapsulated with the resin composition for semiconductor encapsulation of any one of the above [1] to [5].

Advantageous Effects of Invention

According to the present invention, there are provided a resin composition for semiconductor encapsulation that can be a forming material for a cured product capable of realizing a sufficient contrast in laser marking, capable of providing vivid marking and free from a risk of leakage even when applied to high-precision wiring, and a semiconductor device using the resin composition.

BRIEF DESCRIPTION OF DRAWING

FIG. 1 is a cross-sectional view of a dielectric resonator with a measurement sample arranged thereon.

DESCRIPTION OF EMBODIMENTS

First, the resin composition for semiconductor encapsulation of the present invention (hereinafter this may be simply referred to as "the resin composition") is described.

The resin composition for semiconductor encapsulation of the present invention contains (A) an epoxy resin, (B) a phenolic resin-based curing agent, (C) an inorganic filler and (D) amorphous carbon, wherein the amorphous carbon of the component (D) contains 30 atomic % or more of an $SP^3$ structure and 55 atomic % or less of an $SP^2$ structure.

The epoxy resin of the component (A) for use in the present invention is not specifically limited in point of the molecular structure and the molecular weight thereof as long as the epoxy resin has 2 or more epoxy groups in one molecule, and any one generally used for encapsulation in semiconductor devices can be used widely. Specific examples of the epoxy resin include an aliphatic epoxy resin such as a phenol-novolak epoxy resin, a cresol-novolak epoxy resin, a dicyclopentadiene derivative, etc.; an aromatic epoxy resin such as a biphenyl, a naphthyl and a bisphenol ones, etc. One of these epoxy resins may be used singly or two or more thereof may be mixed and used.

The content of the component (A) relative to the total amount of the resin composition is, from the viewpoint of moldability and reliability, preferably from 5 to 30% by mass, more preferably from 5 to 25% by mass, even more preferably from 10 to 20% by mass.

The phenolic resin-based curing agent of the component (B) for use in the present invention is not specifically limited in point of the molecular structure and the molecular weight thereof as long as the phenolic resin-based curing agent has 2 or more phenolic hydroxyl group in one molecule, and any one generally used as a curing agent for epoxy resins can be used widely. Specific examples of the phenolic resin-based curing agent include an aliphatic phenolic resin such as a phenol-novolak resin, a cresol-novolak resin, a dicyclopentadiene derivative, etc.; an aromatic phenolic resin such as a biphenyl, a naphthyl and a bisphenol ones, etc. One of these phenolic resin-based curing agents may be used singly or two or more thereof may be mixed and used.

Preferably, the epoxy resin of the component (A) and the phenolic resin-based curing agent of the component (B) are contained in the resin composition such that the ratio of the epoxy group (a) that the epoxy resin of the component (A) has to the phenolic hydroxyl group (b) that the phenolic resin-based curing agent of the component (B) has, (a)/(b) (equivalent ratio) falls within a range of 0.1 to 2.0, more preferably within a range of 0.5 to 1.5. When the equivalent ratio falls within the range, the moldability of the resin composition and the heat resistance and the moisture resistance of the cured product can be bettered.

The content of the component (B) relative to the total amount of the resin composition is, from the viewpoint of moldability and reliability, preferably from 1 to 15% by mass, more preferably from 3 to 15% by mass, even more preferably from 5 to 10% by mass.

The inorganic filler of the component (C) for use in the present invention includes a metal oxide powder such as a silica powder, an alumina powder, etc.; a metal nitride powder such as a silicon nitride powder, an aluminum nitride powder, etc.; a metal carbide powder such as a silicon carbide powder, etc.; a calcium carbonate powder, a silicon powder, glass fibers, etc. One of these inorganic fillers may be used singly or two or more thereof may be mixed and used.

In the present invention, the inorganic filler of the component (C) is preferably a silica powder. Specifically, the silica powder includes a molten ground silica, a molten spherical silica and a crystalline silica. From the viewpoint of balance with the linear expansion coefficient and the insulation reliability and laser printability of cured products, a molten spherical silica is especially preferred.

Preferably, the inorganic filler of the component (C) has a mean particle size of 1 to 60 μm and a maximum particle size of 200 μm or less. More preferably, the mean particle size is from 5 to 50 μm, and the maximum particle size is 100 μm or less; even more preferably the mean particle size is from 10 to 30 μm and the maximum particle size is 75 μm or less. When the mean particle size is from 1 to 60 μm and the maximum particle size is 200 μm or less, the moldability of the resin composition as well as the laser marking performance on the cured product thereof can be bettered.

For measurement of the mean particle size and the maximum particle size of the inorganic filler of the component (C), for example, a laser diffraction scattering particle sizer (manufactured by Shimadzu Corporation, apparatus name: SALD-3100) can be used.

The content of the component (C) relative to the total amount of the resin composition is preferably from 60 to 95% by mass, more preferably from 65 to 93% by mass, even more preferably from 70 to 90% by mass. When the content is 60% by mass or more, the moldability of the resin composition, as well as the mechanical properties, the heat resistance and the moisture resistance of the cured product thereof can be bettered. In addition, laser marking on the cured product can be vivid. When the content is 95% by mass or less, the flowability and the moldability of the resin composition can be bettered.

The amorphous carbon of the component (D) for use in the present invention contains 30 atomic % or more of an $SP^3$ structure and 55 atomic % or less of an $SP^2$ structure. The amorphous carbon of the component (D) contains an $SP^3$ structure preferably in an amount of 40 atomic % or more, more preferably 46 atomic % or more, and preferably in an amount of less than 70 atomic %, more preferably 60 atomic % or less. The amorphous carbon of the component (D) contains an $SP^2$ structure preferably in an amount of 20 atomic % or more, more preferably 30 atomic % or more, and preferably in an amount of 50 atomic % or less, more preferably 40 atomic % or less.

The ratio of the $SP^3$ structure to the total of the $SP^3$ structure and the $SP^2$ structure is preferably 35% or more, more preferably from 40 to 70%, even more preferably from 45 to 65%.

When the content of the $SP^3$ structure contained in the amorphous carbon is less than 30 atomic % and the content of the $SP^2$ structure is more than 55 atomic %, the insulation performance of the cured product of the resin composition containing the amorphous carbon may lower.

Here, the $SP^3$ structure forms a σ-bond expressed by an $SP^3$ hybrid orbital, and when the content of the $SP^3$ structure is large, light masking performance lowers and colorability is poor. The $SP^2$ structure contains a σ-bond and a π-bond expressed by an $SP^2$ hybrid orbital, and when the content of the $SP^2$ structure is large, π-electrons move readily therefore worsening insulation performance.

Accordingly, when the amorphous carbon of the component (D) contains an $SP^3$ structure and an $SP^2$ structure each in a specific ratio, the cured product of the resin composition containing the amorphous carbon exhibits good coloration and insulation performance, and can therefore realize a sufficient contrast in laser marking, that is, the resin composition enables vivid marking and can prevent a risk of leakage even when applied to high-precision wiring.

The $SP^2$ structure and the $SP^3$ structure can be determined from the ratio of the integral intensity of the $SP^2$ bond-derived peak having a peak center from 1,540 $cm^{-1}$ to 1,650 $cm^{-1}$ to the integral intensity of the $SP^3$ bond-derived peak having a peak center from 1,200 $cm^{-1}$ to 1,500 $cm^{-1}$ in XPS analysis by X-ray photoelectron spectrometry.

The production method for the amorphous carbon of the component (D) is not specifically limited, and examples thereof include a method of vaporizing a carbon source to be a starting material according to a heating method such as a resistance heating method, a laser heating method, an arc discharge method, a high-frequency plasma method, a plasma jet method, a microwave heating method or the like, followed by cooling and re-solidifying the carbon vapor, and a method of heating synthesized spherical carbon particles.

Specifically, a method of generating a carbon vapor by arc discharging between carbon rod electrodes in vacuum or in an inert gas atmosphere such as helium gas in which the vaporization speed of carbon is high can be employed. The amorphous carbon thus obtained can be processed in a grinding and classification step to have a suitable particle size.

It may also be obtained by heat-treating synthesized fine spherical particles.

A method for synthesizing fine spherical particles includes, though not specifically limited thereto, a method of producing a granular or powdery resin by adding a hydrophilic polymer compound to a condensation product prepared by reacting a phenol and a formaldehyde at least in the presence of a nitrogen-containing compound, and reacting them (JP-B 53-42077), and a method of mixing a prepolymer prepared through reaction of a phenol and a formaldehyde in an aqueous chlorine solution with a protective colloid, and solidifying them into inert solid beads in an acidic condition (JP-B 51-13491).

Further, the particles may also be synthesized according to a microwave heating method of heating a phenol and an aldehyde with microwaves. The spherical particles synthesized according to a microwave heating method are more uniform and finer spherical particles, and are especially preferred.

The heat treatment temperature is preferably from 500 to 1,200° C., more preferably from 500 to 1,000° C. When the heat treatment temperature is defined to fall within the above range, the resultant amorphous carbon may be made to have a structure that contains 30 atomic % or more of an $SP^3$ structure and 55 atomic % or less of an $SP^2$ structure. In addition, when the heat treatment temperature is 500° C. or higher, the blackness degree and the light-blocking performance of the cured product can be bettered, and when the heat treatment temperature is 1,200° C. or lower, the $SP^2$ structure contained in the amorphous carbon can be made to be 55 atomic % or less, and the insulation performance of the cured product can be bettered.

The ambient pressure for carbon vaporization is preferably 20 kPa or more, and by controlling the reduced pressure under the above condition, the resultant amorphous carbon may be made to have a structure that contains 30 atomic % or more of an $SP^3$ structure and 55 atomic % or less of an $SP^2$ structure, and the electrical resistivity of the amorphous carbon can be controlled to be $10^6$ Ωcm or more. When the pressure is 20 kPa or more, the content of the $SP^3$ structure in the amorphous carbon can be made to be 30 atomic % or more, and the insulation performance of the cured product can be thereby bettered.

Preferably, the amorphous carbon of the component (D) is a powder having a weight average particle size of 50 μm or less, more preferably a powder of 0.01 to 50 μm, even more preferably 0.05 to 5 μm. When the weight average particle size is 50 μm or less, good dispersibility can be realized and coloration performance can be bettered, and as a result, a sufficient marking contrast can be obtained and vivid marking is possible therefore bettering distinguishability after laser marking.

The weight average particle size is a value measured with a laser diffraction scattering particle sizer (manufactured by Shimadzu Corporation, apparatus name: SALD-3100).

Also preferably, the amorphous carbon of the component (D) has a specific surface area according to a nitrogen adsorption method (BET method) of 10 to 1,000 m²/g, more preferably 12 to 800 m²/g. When the specific surface area is limited to be 10 m²/g or more, the dispersibility improves and the coloration performance betters. When the specific surface area is limited to be 1,000 m²/g or less, the bulk density can be prevented from lowering and the flowability of the resin composition can better.

In the present invention, the amorphous carbon of the component (D) can be controlled to have a desired particle size by grinding.

The method for grinding the amorphous carbon is not specifically limited, for which any ordinary grinding machine such as a cutting mill, a ball mill, a cyclone mill, a hammer mill, a vibrational mill, a cutter mill, a grinder mill, a speed mill or the like is employable. Further, the ground powder of the amorphous carbon obtained by the above-mentioned grinding operation can be subjected to a classification step of processing the powder for sieving classification or air classification to give a particulate aggregate having a desired particle size distribution.

A thermosetting resin material such as a phenolic resin, a polyimide resin or the like may be shaped into particles having a desired particle size, and then fired to give carbon particles. For example, there is known a method where a phenol is added to water and ethanol and dissolved therein, then an aldehyde in an equivalent amount of 2 times the phenol is added thereto and stirred, and 10 mass % aqueous ammonia serving as a catalyst is added and reacted for a given time to produce monodispersed spherical carbon particles. Further, in the reaction, by controlling the ethanol concentration of the solvent and the ammonia concentration, the particles can be controlled to have a desired particle size. The thus-obtained, monodispersed spherical carbon particles may be heated in vacuum or in an inert gas atmosphere under the condition of 500° C. to 1,200° C. to give a monodispersed amorphous carbon, and the method is preferred.

The content of the component (D) relative to the total amount of the resin composition is preferably from 0.01 to 5.0% by mass, more preferably from 0.02 to 4.0% by mass, even more preferably from 0.1 to 3.0% by mass. When the amount is 0.01% by mass or more, laser marking visibility betters. When the amount is 5.0% by mass or less, the flowability of the resin composition can better.

The amorphous carbon of the component (D) is incorporated as a black colorant, and derivatives thereof prepared through hydrogenation, oxidization, alkylation, amination, halogenation, cyclizing addition or inclusion of the amorphous carbon, or those prepared by surface-treating the amorphous carbon with a coupling agent or the like are also usable.

The amorphous carbon of the component (D) contains 30 atomic % or more of an $SP^3$ structure that is a characteristics of a diamond structure, and contains a small amount of 55 atomic % or less of an $SP^2$ structure that is a characteristic of carbon black or a graphite structure, and is therefore given insulation performance.

On the other hand, a special material fullerene expresses insulation performance though it contains a large amount of 60 atomic % or more of an $SP^2$ structure and contains a small amount of 30 atomic % or less of an $SP^3$ structure, and this is because, in the fullerene, the $SP^2$ structure is a spherical structure to block electron movement therein. The fullerene is produced according to a specially-controlled method and is extremely expensive as its production efficiency is low.

On the other hand, the amorphous carbon for use in the present invention can be produced according to an ordinary process of producing carbon black or graphite, and is inexpensive as its production efficiency is high.

Consequently, without incorporating a fullerene thereinto, a resin composition for semiconductor encapsulation that is inexpensive and has good coloration performance and reliability can be obtained.

The resin composition for semiconductor encapsulation of the present invention may contain any other carbon compound than the component (D), such as carbon black, graphite or the like, along with the amorphous carbon of the component (D). The content of the other carbon compound than the component (D) is preferably from 0 to 200 parts by mass relative to 100 parts by mass of the total amount of the component (D), more preferably from 0 to 150 parts by mass, even more preferably from 0 to 100 parts by mass.

The resin composition for semiconductor encapsulation of the present invention contains, as indispensable components, the epoxy resin (A), the phenolic resin-based curing agent (B), the inorganic filler (C) and the amorphous carbon (D) containing 30 atomic % or more of an $SP^3$ structure and 55 atomic % or less of an $SP^2$ structure, as described above, but as needed and within a range not detracting from the advantageous effects of the present invention, a curing accelerator; a release agent such as a natural wax, a synthetic wax, an ester, a linear aliphatic metal salt, an acid amide, a paraffin, etc.; a low stress-imparting agent such as a rubber-like or silicone-type polymer, etc.; a coupling agent as a treatment agent for an inorganic filler, etc., which are generally incorporated in compositions of this kind, may be further incorporated in the composition. In addition, when necessary, a colorant such as cobalt blue or the like may also be incorporated within a range not detracting from the advantageous effects of the present invention.

Examples of the curing accelerator include an organic phosphorus-containing curing accelerator such as trimethyl phosphine, triethyl phosphine, tributyl phosphine, triphenyl phosphine, tri(p-methylphenyl) phosphine, tri(nonylphenyl) phosphine, methyldiphenyl phosphine, dibutylphenyl phosphine, tricyclohexyl phosphine, bis(diphenylphosphino)methane, 1,2-bis(diphenylphosphino)ethane, tetraphenylphosphonium tetraphenylborate, triphenylphosphine tetraphenylborate, triphenylphosphine triphenylborane, etc.; a diazabicycloalkene compound-type curing promoter such as 1,8-diazabicyclo[5,4,0]undecane-7 (DBU), 1,5-diazabicyclo(4,3,0)nonene-5, etc.; an imidazole-type curing accelerator such as 2-heptadecylimidazole, 2-methylimidazole, 2-ethylimidazole, 2-phenylimidazole, 2-phenyl-4-methylimidazole, 4-methylimidazole, 4-ethylimidazole, 2-phenyl-4-hydroxymethylimidazole, 2-ethyl-4-mehtylimidazole, 1-cyanoethyl-2-methylimidazole, 2-phenyl-4-mehtyl-5-hydroxymethylimidazole, 2-phenyl-4,5-dihydroxymethylimidazole, etc.; a tetraphenylboron-type curing accelerator such as 2-ethyl-4-methylimidazole tetraphenylborate, etc. One of these curing accelerators may be used singly or two or more thereof may be mixed and used.

The content of the curing accelerator relative to the total amount of the resin composition is preferably from 0.01 to 1.0% by mass, more preferably from 0.1 to 1.0% by mass, even more preferably from 0.1 to 0.5% by mass.

The coupling agent includes a silane coupling agent such as γ-glycidoxypropyltrimethoxysilane, γ-glycidoxypropylmethyldiethoxysilane, β-(3,4-epoxycyclohexyl)ethyltrimethoxysilane, γ-(methacryloylpropyl)trimethoxysilane, γ-aminopropyltrimethoxysilane, N-β-(aminoethyl)-γ-aminopropyltrimethoxysilane, N-β-(aminoethyl)-γ-aminopropylmethyldimethoxysilane, N-β-(aminoethyl)-γ-aminopropylmethyldiethoxysilane, N-phenyl-γ-aminopropyltrimethoxysilane, γ-ureidopropyltriethoxysilane, γ-mercaptopropyltrimethoxysilane, γ-mercaptopropylmethyldimethoxysilane, bis(3-triethoxysilylpropyl)tetrasulfane, methyltrimethoxysilane, methyltriethoxysilane, vinyltrimethoxysilane, vinyltriacetoxysilane, imidazolesilane, etc., and in addition, a titanium coupling agent, an aluminum alcoholate and the like are also usable. One of these coupling agents may be used singly or two or more thereof may be mixed and used.

The resin composition for semiconductor encapsulation of the present invention may be prepared by uniformly mixing (A) an epoxy resin, (B) a phenolic resin-based curing agent, (C) an inorganic filler and (D) amorphous carbon containing 30 atomic % or more of an $SP^3$ structure and 55 atomic % or less of an $SP^2$ structure, optionally along with various components mentioned above that are incorporated as needed, in a mixer or the like, and then further heating, melting and kneading them with a hot roll, a kneader or the like, and thereafter cooling and solidifying the resultant melt, and grinding the solid into a suitable size.

Alternatively, the amorphous carbon of the component (D) may be previously mixed with at least one, preferably all of the epoxy resin of the component (A) and/or the phenolic resin-based curing agent of the component (B), and heated, melted and kneaded, and the resultant pre-mixture may be mixed with the other components. By using such a pre-mixture, the moldability of the resin composition and the insulation reliability of the cured product can be further bettered.

Optionally, a release agent, any other colorant, a coupling agent and the like may be added to the pre-mixture.

The semiconductor device of the present invention is one prepared by encapsulating a semiconductor element with the above-mentioned resin composition for semiconductor encapsulation.

The semiconductor device can be readily produced by encapsulating the semiconductor element with the resin composition for encapsulation. Examples of the semiconductor element include, though not specifically limited thereto, an integrated circuit, a large-scale integration circuit, a transistor, a thyristor, a diode, etc. As the method for encapsulating semiconductor elements, a low-pressure transfer molding method is most popular, but encapsulation according to a method of injection molding, compression molding, casting or the like is also employable, and by molding in vacuum as needed, filling performance into interspaces can be further improved. During encapsulation the resin composition for encapsulation is cured by heating, and the temperature at the process is desirably 150° C. or higher.

The semiconductor device of this kind can be marked in the encapsulation resin part by carbon dioxide laser, YVO4 laser, YAG laser, excimer laser or the like. Marking with various lasers may be carried out according to conventional methods with no specific limitation thereon.

The semiconductor device of the present invention is one encapsulated with the above-mentioned resin composition for encapsulation, and therefore can realize a sufficient contrast in marking according to conventional methods and can realize a vivid marking, and even when applied to high-precision wiring, the device can prevent occurrence of leakage.

EXAMPLES

The present invention is described concretely with reference to the following Examples, but the present invention is not whatsoever restricted by these Examples.

Synthesis Example 1

An evaluation sample was synthesized according to an ordinary thermal CVD method mentioned below. Specifically, a raw material gas mixture containing acetylene, carbon dioxide and an inert gas was heated for synthesis in a heating furnace chamber heated at 1,000° C. In the raw material gas mixture, the acetylene partial pressure was $10 \times 10^2$ Pa, and the carbon dioxide partial pressure was $7 \times 10^3$ Pa. The partial pressure ratio of acetylene to carbon dioxide (acetylene/carbon dioxide) was 5.

In the synthesis step, thermal CVD reaction was carried out for 30 minutes to synthesis amorphous carbon. The synthesized amorphous carbon was ground for 2 hours, using a dry jet-mill grinding machine, thereby giving an amorphous carbon powder having a weight average particle size of 4 μm.

In the resultant amorphous carbon, the $SP^3$ structure was 45 atomic %, and the $SP^2$ structure was 42 atomic %, and the electroconductivity of the amorphous carbon was 0.8 S/m.

Synthesis Example 2

Spherical fine particles obtained according to a microwave heating method mentioned below were heated to synthesize an evaluation sample.

Specifically, 40 mmol of 3-aminophenol, 23.8 mmol of aqueous ammonia, 17 ml of ethanol and 10 ml of pure water were stirred, then 93.8 mmol of formaldehyde was added and further stirred to prepare a suspension. Next, this was irradiated with 2.45 GHz microwaves for 1 hour for reaction, and then through centrifugal separation, spherical phenolic resin fine particles having a weight average particle size of 0.3 μm were collected. Further, the spherical phenolic resin fine particles were heated in a heating furnace chamber heated at 700° C., thereby giving spherical amorphous carbon particles having a weight average particle size of 0.25 μm.

In the resultant amorphous carbon, the $SP^3$ structure was 50 atomic %, and the $SP^2$ structure was 38 atomic %, and the electroconductivity of the amorphous carbon was 0.5 S/m.

Example 1

Components were blended in a ratio shown in Table 2, mixed at room temperature (25° C.) using a mixer, heated and kneaded for 2 hours at a temperature of 90 to 95° C. using a pressure kneader (Model Name: KRC-T-2, manufactured by Kurimoto, Ltd.), then cooled and solidified, and thereafter ground into a suitable particle size using a mill grinding machine (Model Name: ND-30, manufactured by Tajima-KK.), thereby producing a resin composition for encapsulation.

Examples 2 to 12, Comparative Examples 1 to 3

In the same manner as in Example 1, components were blended in a ratio shown in Table 2 to produce resin compositions for encapsulation.

The resin composition for encapsulation obtained in the above Examples 1 to 12 and Comparative Examples 1 to 3 was transfer-molded under the condition of 175° C. and 2 minutes, and further post-cured at 175° C. for 8 hours to produce a molded product for test having a thickness of 1.0 mm. Semiconductor chips for evaluation were resin-encapsulated under the same condition to produce a semiconductor package [QFP 256 pin package (28 mm×28 mm×1.4 mm, wiring clearance 50 μm)].

Raw materials used in Examples and Comparative Examples are as follows.

(A) Component: Epoxy Resin
O-cresol-novolak resin (manufactured by Sumitomo Chemical Co., Ltd., trade name: EOCN-195XL-70; epoxy equivalent: 198)

(B) Component: Phenolic Resin-Based Curing Agent
Phenol-novolak resin (manufactures by Showa Highpolymer Co., Ltd., trade name: BRG-557; hydroxyl group equivalent: 105)

(C) Component: Inorganic Filler
Powder of molten spherical silica (manufactured by Denka Company Limited, trade name: FB-60; mean particle size: 23 μm; maximum particle size: 75 μm or less)

(D) Component: Amorphous Carbon
Amorphous carbon obtained in Synthesis Example 1 or Synthesis Example 2

Other Components
Carbon black (manufactured by Mitsubishi Chemical Corporation, trade name: MA-600; mean particle size: 20 nm; electroconductivity: 6.8 S/m)

C60 fullerene (manufactured by Frontier Carbon Corporation, trade name: Nanom Purple; weight average particle size: 20 μm)

Carnauba wax (manufactured by Toyo Petrolite Corporation, trade name: Carnauba Wax)

Coupling agent (manufactured by NUC Corporation, trade name: A-187)

Curing accelerator (manufacture by Hokko Chemical Industry Co., Ltd., trade name: PP-200)

According to the evaluation methods mentioned below, the proportion of the $SP^3$ structure and the $SP^2$ structure in the amorphous carbon obtained in Synthesis Example 1 and Synthesis Example 2 and carbon black and C60 fullerene, and the electroconductivity thereof were measured. The results are shown in Table 1.

[Proportion of $SP^3$ Structure and $SP^2$ Structure]

One spatula of a sample powder for measurement was set on a glass substrate, and the powder was analyzed. The peak intensity having a peak center in a range of 1,540 $cm^{-1}$ to 1,650 $cm^{-1}$ in Raman spectrophotometry using a microscopic laser Raman spectrophotometer (LabRam HR-800, manufactured by Horiba, Ltd.) was referred to as an $SP^2$ structure, and the peak intensity having a peak center in a range of 1,200 $cm^{-1}$ to 1,500 $cm^{-1}$ was referred to as an $SP^3$ structure; and through peak fitting, the peak intensity ratio of the $SP^3$ structure and the $SP^2$ structure was determined.

[Electroconductivity]

FIG. 1 is a cross-sectional view of a dielectric resonator with a measurement sample 7 put in a zippered plastic bag arranged thereon. The measurement sample 7 (height: 4 mm) was mounted on a sample bed 4 formed of a low-dielectric material (relative permittivity: 2.0, thickness: 1 mm) of a dielectric resonator 1. The dielectric resonator 1 was formed of a columnar dielectric substance 2 (relative permittivity: 45.2, dielectric tangent: $76.5 \times 10^{-5}$, diameter: 15 mm, height: 7.5 mm), a supporting bed 3 formed of a low-dielectric material (relative permittivity: 2.0, dielectric tangent: $2 \times 10^{-4}$, outer diameter: 20 mm, inner diameter: 6 mm, height: 10 mm), a cylindrical masking conductor 5, and a lower masking conductor 6. The distance between the sample bed 4 and the lower masking conductor 6 was 24.5 mm and the inner diameter of the cylindrical masking conductor 5 was 24.5 mm.

A through-hole was formed in the +y direction side (5a) and the −y direction side (5b) of the cylindrical masking conductor 5, a semi-rigid coaxial cable with a loop antenna formed at the distal end thereof was inserted into each through-hole, and each coaxial cable was connected with a network analyzer (trade name; 8722ES, manufactured by Agilent Technologies Corporation) to resonate the dielectric resonator 1 in a TE resonance mode to measure the resonance characteristics of the system.

In resonating the dielectric resonance 1 in a TE resonate mode, the electromagnetic field leaked from the sample bed 4 would run also into the inside of the measurement sample 7, and therefore the dielectric constant of the measurement sample 7 could have some influence on the resonance characteristics of the dielectric resonator 1. Accordingly, by comparing the measurement value of the resonance characteristic of the dielectric resonator 1, especially that under no load Q (Qu), and the simulation results of the resonance characteristics in change of the electroconductivity of the measurement sample 7, especially the electromagnetic field Qu, the electroconductivity of the measurement sample 7 was determined.

TABLE 1

| Material | No Load Q (Qu) | Resonance Frequency [GHz] | Electroconductivity [S/m] | $SP^3$ structure [atomic %] | $SP^2$ structure [atomic %] |
| --- | --- | --- | --- | --- | --- |
| Amorphous Carbon of Synthesis Example 1 | 367 | 3.073 | 0.8 | 45 | 42 |
| Amorphous Carbon of Synthesis Example 2 | 601 | 3.074 | 0.5 | 50 | 38 |
| MA-600 (carbon black) | 201 | 3.079 | 6.8 | 27 | 58 |
| Nanom Purple (C60 Fullerene) | 622 | 3.075 | 0.4 | 28 | 61 |

The spiral flow of each resin composition for encapsulation mentioned above was measured according to the method mentioned below to evaluate the moldability thereof. The molded product for test was evaluated in point of the outward appearance and the laser marking performance, and the light transmittance thereof was measured. Further, the resin-encapsulated semiconductor package was evaluated in point of the insulation reliability according to the method mentioned below. The results are shown in Table 2.

[Moldability]

Using a spiral flow mold according to EMMI-1-66, the resin composition for encapsulation was transfer-cast into the spiral flow mold heated at 175° C. and cured therein, and the flowing length was measured. A larger flowing length indicates that the sample has excellent flowability.

[Appearance]

The appearance color of the molded product for test was visually checked. The appearance evaluation was made according to the following criteria.

A: good
B: average (no problem in practical use)
C: not good (problematic in practical use)

[Laser Marking Performance]

Using a YAG laser marking apparatus manufactured by Keyence Corporation, marking was made on the molded product for test, under the condition of an output power 14 A, a frequency 5.0 kHz, a marking speed 400 mm/sec and a letter line width 0.2 mm, and the laser marking performance of the sample was evaluated according to the following criteria.

A: good
B: average (no problem in practical use)
C: not good (problematic in practical use)

[Light Transmittance]

Using a spectrophotometer V-570 manufactured by JASCO Corporation, the light transmittance through a thickness of 1 mm was measured at a wavelength of 300 to 800 nm.

[Insulation Reliability]

Samples were tested in an electrical current test, and checked for presence or absence of leakage between pads.

TABLE 2

| | | Unit | Component | Example 1 | Example 2 | Example 3 | Example 4 | Example 5 | Example 6 | Example 7 |
| --- | --- | --- | --- | --- | --- | --- | --- | --- | --- | --- |
| Epoxy Resin (o-cresol-novolak resin) | | part by mass | (A) | 12 | 12 | 12 | 18 | 12 | 12 | 12 |
| Phenolic Resin-based Curing Agent (phenol-novolak resin) | | part by mass | (B) | 6 | 6 | 6 | 8 | 6 | 6 | 6 |
| Inorganic Filler (powder of molten spherical silica) | | part by mass | (C) | 80 | 80 | 80 | 71 | 89 | 80 | 80 |
| Amorphous Carbon (Synthesis Example 1) | | part by mass | (D) | 0.4 | 0.8 | 0.2 | 0.6 | 0.2 | — | — |
| Amorphous Carbon (Synthesis Example 2) | | part by mass | (D) | — | — | — | — | — | 0.4 | 0.8 |
| Carbon Black | | part by mass | — | — | — | — | — | — | 0.4 | 0.8 |
| C60 Fullerene | | part by mass | — | — | — | — | — | — | — | — |
| Carnauba Wax | | part by mass | — | 0.4 | 0.4 | 0.4 | 0.5 | 0.4 | 0.4 | 0.4 |
| Coupling Agent | | part by mass | — | 1 | 1 | 1 | 1 | 1 | 1 | 1 |
| Curing Accelerator | | part by mass | — | 0.2 | 0.2 | 0.2 | 0.3 | 0.2 | 0.2 | 0.2 |
| Total | | part by mass | — | 100 | 100.4 | 99.8 | 99.4 | 108.8 | 100.4 | 101.2 |
| Evaluation Results | Moldability (spiral flow) | cm | — | 85 | 87 | 86 | 115 | 65 | 85 | 87 |
| | Molded Product (appearance) color/evaluation | — | — | black/A | black/A | black/A | black/A | black/A | black/A | black/A |
| | Laser Marking Performance | — | — | A | A | A | A | A | A | A |
| | Light Transmittance (400 to 800 nm) | % | — | 0 | 0 | 0 | 0 | 0 | 0 | 0 |
| | Insulation Reliability (occurrence of leakage) | — | — | no leakage | no leakage | no leakage | no leakage | no leakage | no leakage | no leakage |

| | Example 8 | Example 9 | Example 10 | Example 11 | Example 12 | Comparative Example 1 | Comparative Example 2 | Comparative Example 3 |
| --- | --- | --- | --- | --- | --- | --- | --- | --- |
| Epoxy Resin (o-cresol-novolak resin) | 12 | 18 | 12 | 12 | 12 | 12 | 12 | 12 |
| Phenolic Resin-based Curing Agent (phenol-novolak resin) | 6 | 8 | 6 | 6 | 6 | 6 | 6 | 6 |

TABLE 2-continued

|  |  |  |  |  |  |  |  |  |
|---|---|---|---|---|---|---|---|---|
| Inorganic Filler (powder of molten spherical silica) | | 80 | 71 | 89 | 80.35 | 80.35 | 80.35 | 80 | 80 |
| Amorphous Carbon (Synthesis Example 1) | | 0.4 | — | — | 0.05 | — | — | — | — |
| Amorphous Carbon (Synthesis Example 2) | | — | 0.6 | 0.2 | — | 0.05 | — | — | — |
| Carbon Black | | 0.2 | 0.6 | 0.2 | — | — | 0.05 | 0.8 | — |
| C60 Fullerene | | — | — | — | — | — | — | — | 0.4 |
| Carnauba Wax | | 0.4 | 0.5 | 0.4 | 0.4 | 0.4 | 0.4 | 0.4 | 0.4 |
| Coupling Agent | | 1 | 1 | 1 | 1 | 1 | 1 | 1 | 1 |
| Curing Accelerator | | 0.2 | 0.3 | 0.2 | 0.2 | 0.2 | 0.2 | 0.2 | 0.2 |
| Total | | 100.2 | 100 | 109 | 100 | 100 | 100 | 100.4 | 100 |
| Evaluation Results | Moldability (spiral flow) | 86 | 115 | 65 | 87 | 87 | 87 | 86 | 84 |
|  | Molded Product (appearance) color/evaluation | black/A | black/A | black/A | gray/B | black/A | gray/B | black/A | brown/B |
|  | Laser Marking Performance | A | A | A | A | A | B | A | B |
|  | Light Transmittance (400 to 800 nm) | 0 | 0 | 0 | 0 | 0 | 5 | 0 | 2 |
|  | Insulation Reliability (occurrence of leakage) | no leakage | no leakage | no leakage | no leakage | no leakage | no leakage | leakage occurred | no leakage |

As obvious from the results in Table 2, the resin composition for semiconductor encapsulation of the present invention has a flow length of 65 to 115 cm and the appearance of the molded product thereof was good in every case. In addition, the light transmittance was 0% in every case, that is, the composition was excellent in light blocking performance and was also excellent in laser marking performance. Further, the semiconductor package encapsulated using the resin composition for semiconductor encapsulation of the present invention was free from leakage and was excellent in insulation reliability.

INDUSTRIAL APPLICABILITY

A cured product of the resin composition for semiconductor encapsulation of the present invention is excellent in laser marking performance, free from leakage and excellent in insulation reliability, and is therefore applicable as an encapsulation material for various semiconductor elements as typified by large-scale integration circuits.

REFERENCE SIGNS LIST

1 Dielectric Resonator
2 Columnar Dielectric Substance
3 Supporting Bed
4 Sample Bed
5 Cylindrical Masking Conductor
5a, 5b Side of Cylindrical Masking Conductor
6 Lower Masking Conductor
7 Measurement Sample

The invention claimed is:

1. A resin composition for semiconductor encapsulation, comprising component (A) an epoxy resin, component (B) a phenolic resin-based curing agent, component (C) an inorganic filler, and component (D) amorphous carbon, wherein the amorphous carbon of the component (D) contains 30 atomic % to 70 atomic % of an $SP^3$ structure and 20 atomic % to 55 atomic % or less of an $SP^2$ structure,
    wherein a content of the component (C) is from 65 to 95% by mass relative to a total amount of the resin composition,
    wherein the component (C) is at least one selected from the group consisting of a metal oxide powder, a metal nitride powder, a metal carbide powder, a calcium carbonate powder, a silicon powder, and glass fibers,
    wherein the content of the component (A) relative to the total amount of the resin composition is from 5 to 30% by mass
    wherein the ratio of the atomic % of the $SP^3$ structure to the total atomic % of the $SP^3$ structure and the $SP^2$ structure is from 40% to 70%.

2. The resin composition for semiconductor encapsulation according to claim 1, wherein the amorphous carbon of the component (D) has a weight average particle size of 0.01 to 50 μm.

3. The resin composition for semiconductor encapsulation according to claim 1, wherein the inorganic filler of the component (C) has a mean particle size of 1 to 60 μm and a maximum particle size of 200 μm or less.

4. The resin composition for semiconductor encapsulation according to claim 1, wherein the inorganic filler of the component (C) is a silica powder.

5. A semiconductor device comprising a semiconductor element encapsulated with the resin composition for semiconductor encapsulation of claim 1.

6. The resin composition for semiconductor encapsulation according to claim 1, wherein the component (C) is a metal oxide powder.

* * * * *